United States Patent [19]
Satoh et al.

[11] Patent Number: 5,153,518
[45] Date of Patent: Oct. 6, 1992

[54] SYNTHETIC EQUIVALENT TEST CIRCUIT OF CIRCUIT BREAKER

[75] Inventors: Minori Satoh; Isao Takahashi; Yukio Kurosawa; Kastuichi Kashimura; Kunio Hirasawa, all of Hitachi, Japan

[73] Assignee: Hitachi, Ltd., Tokyo, Japan

[21] Appl. No.: 578,798

[22] Filed: Sep. 7, 1990

[30] Foreign Application Priority Data

Sep. 20, 1989 [JP] Japan .................... 1-242200

[51] Int. Cl.⁵ .......................................... G01R 31/32
[52] U.S. Cl. ..................................... 324/424; 324/415
[58] Field of Search ............... 324/415, 418, 423, 424

[56] References Cited
FOREIGN PATENT DOCUMENTS

| | | | |
|---|---|---|---|
| 0102176 | 6/1983 | Japan | 324/424 |
| 0207079 | 10/1985 | Japan | 324/424 |
| 0221686 | 10/1986 | Japan | 324/424 |
| 0225675 | 10/1986 | Japan | 324/415 |
| 0116470 | 5/1989 | Japan | 324/424 |
| 0292274 | 11/1989 | Japan | 324/424 |
| 0122289 | 5/1990 | Japan | 324/418 |

Primary Examiner—Kenneth A. Wieder
Assistant Examiner—Glenn W. Brown
Attorney, Agent, or Firm—Antonelli, Terry, Stout & Kraus

[57] ABSTRACT

The invention relates to a synthetic equivalent test circuit which can generate a 4-parameter transient recovery voltage TRV, for verifying a large current breaking performance of a power circuit breaker. A current source current is supplied to only a testing circuit breaker which is to be tested and an auxiliary circuit breaker. A small current with respect to the current source current is transmitted to the first and second auxiliary switches from a power source. When the small current form the current source or the resonance circuit flows, the first auxiliary switch is opened almost simultaneously with the auxiliary circuit breaker, the testing circuit breaker and operates so as to break the current at the time point of the final zero point of the current source current. Therefore, the connection of the voltage source circuit just before the final zero point of the current source current, that is, the current supply of the voltage source current and the breaking of a capacitor circuit current by the first auxiliary switch generates a 4-parameter TRV that can be accomplished easily.

5 Claims, 5 Drawing Sheets

FIG. 1 PRIOR ART

CURRENT SOURCE CIRCUIT OF LOW VOLTAGE ← | → VOLTAGE SOURCE CIRCUIT OF HIGH VOLTAGE

SYNTHETIC EQUIVALENT TEST CIRCUIT OF CIRCUIT BREAKER

BACKGROUND OF THE INVENTION

The present invention relates to a synthetic equivalent test circuit to verify a large current breaking performance of a power circuit breaker and, more particularly, to a circuit to generate a 4-parameter transient recovery voltage (hereinafter, abbreviated to TRV).

The progress of development of the large capacity power circuit breaker has been remarkable. In recent years, a circuit breaker having rated voltages from 362 to 420 kV has been constructed with one break per phase. Further, a study is carried out to realize the circuit breaker having a rated voltage 550 kV with single-break.

On the other hand, according to the International Electrotechnical Commission (hereinafter, abbreviated to IEC) and the Japanese Electrotechnical Committee (hereinafter, abbreviated to JEC) regarding the breaking tests of a large capacity power circuit breaker, what is called a 4-parameter TRV in which a peak value appears later is specified as a voltage waveform which is applied between poles of a circuit breaker which interrupted the current.

That is, the 4-parameter TRV means that after the current of a predetermined magnitude was broken, there are specified four parameters comprising first and second reference times of voltage waveform which are applied between the contacts of the circuit breaker to be tested and first and second reference voltage values at those times, and if the four parameters satisfy request values, it is determined that the testing circuit breaker has a desired breaking performance.

However, the TRV which is generated by a Weil synthetic equivalent test circuit which has conventionally widely been used for verification of the breaking performance relates to the oscillation of a single frequency and is called a 2-parameter TRV. Therefore, many methods of improving the test circuit so that they can generate a 4-parameter TRV have been proposed. However, there are economical and technical subjects. Only a few examples of such improved test circuits have been put into practical use for the commercially available tests and are not widely used yet.

The 2-parameter TRV denotes that for the above 4-parameter TRV, two parameters of only one reference time $t_3$ of a voltage waveform which is applied between the contacts of a testing circuit breaker after the current was broken and a reference voltage value $u_c$ at that time are specified and if the two parameters satisfy the specified values, it is decided that the testing circuit breaker has an enough breaking performance.

As mentioned above, there is a problem such that as the number of breaks per pole of the circuit breaker decreases, it is severer for the 2-parameter TRV than a specified TRV or the like. The necessity of a circuit which can economically generate a 4-parameter TRV having a long peak time $t_2$ for a 2-parameter TRV having a short peak time is more and more increasing.

Figure 1:
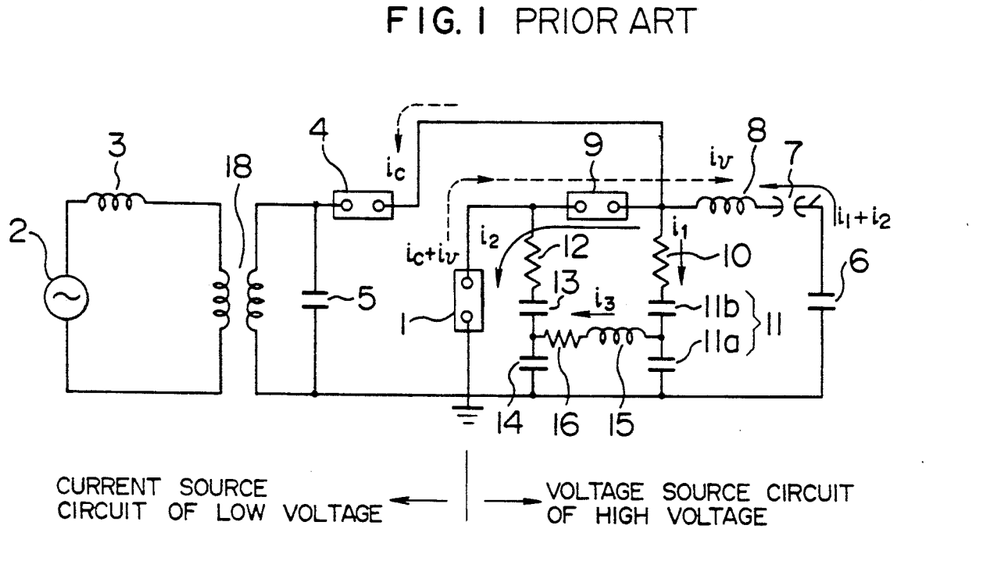
FIG. 1 is a diagram of a conventional synthetic equivalent test circuit of a circuit breaker.
Figure 2:
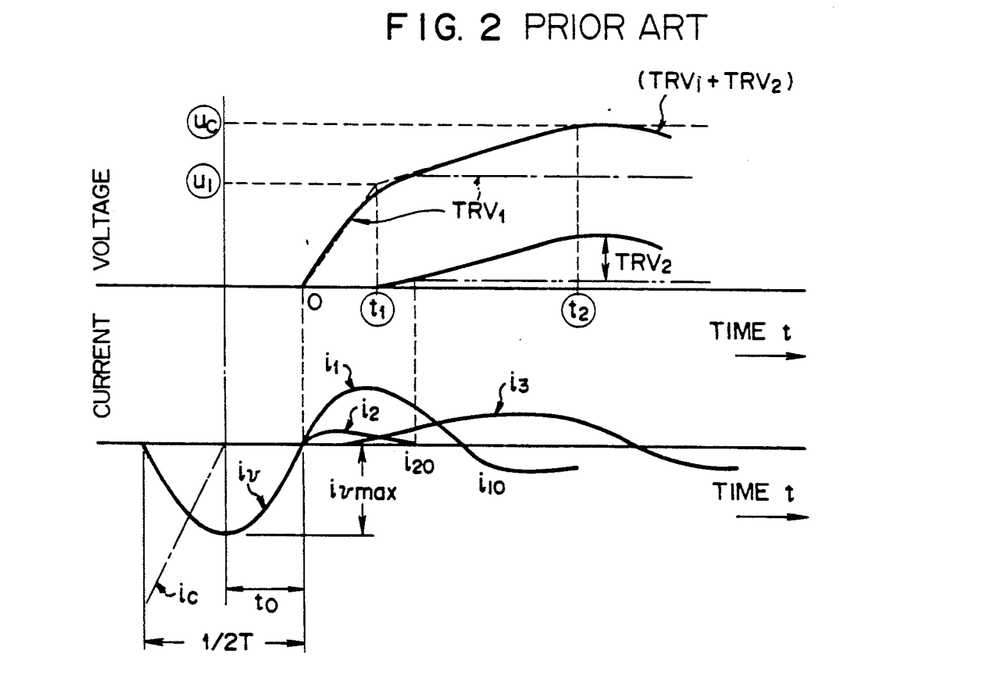
FIG. 2 is a diagram for explaining a phenomenon in the test circuit shown in FIG. 1.

FIG. 1 shows an embodiment of a conventional 4-parameter TRV generating circuit. FIG. 2 is a diagram for explaining a phenomenon in the circuit of FIG. 1.

The above conventional 4-parameter TRV generating circuit has been disclosed in the literature by ISAO TAKAHASHI, MINORI SATOH, and SHUNJI TOKUYAMA (all of them belong to Hitachi Research Laboratory, HITACHI. LTD., Japan), "FOUR-PARAMETER TRANSIENT RECOVERY VOLTAGE CIRCUITS APPROPRIATE FOR TESTING OF EXTRA HIGH VOLTAGE CIRCUIT BREAKERS", IEEE Transactions on Power Delivery, Vol. 3, No. 1, page 233, FIGS. 3 and 4, January, 1988.

In FIG. 1, the left side diagram including a circuit breaker 1 which is used for testing shows a current source circuit of a low voltage and the remaining right side shows a voltage source circuit of a high voltage. A current source current $i_c$ is supplied to an auxiliary switch 9 arranged in the voltage source circuit from on A.C. power source 2 through a reactor 3 for current adjustment, a transformer 18, and an auxiliary circuit breaker 4. The current $i_c$ flows through the auxiliary switch 9 and the testing circuit breaker 1. In this case, a current source protection surge absorber 5 is connected to the position shown in the diagram in many cases.

After the current was allowed to flow, the auxiliary circuit breaker 4 to protect the circuit from a high voltage and auxiliary switch 9 and the circuit breaker 1 to be tested are closed and the current source current $i_c$ is supplied. After that, for instance, the auxiliary circuit breaker 4, auxiliary switch 9, and testing circuit breaker 1 are almost simultaneously opened. A control gap 7 is discharged just before the final zero point of the current source current $i_c$. A voltage source current $i_v$ is allowed to flow from a capacitor 6, which has previously been charged, through the control gap 7, a reactor 8, the auxiliary switch 9, and the testing circuit breaker 1 as shown in FIGS. 1 and 2.

An injection time point of the voltage source current $i_v$ is located before the current zero period of the current source current $i_c$ because the current injection method is used here. Also, a period ($t_0$) of only the voltage source current lies within a range from $\frac{1}{8}$ to $\frac{1}{4}$ of a period (T) of the voltage source current.

In FIG. 1, when the testing circuit breaker 1 has succeeded in breaking the current, currents $i_1$ to $i_3$ flow by a residual voltage in the capacitor 6 as shown in FIG. 2. A branch path in which the current $i_1$ flows comprises a series circuit of a resistor 10 and a capacitor $11b$. A branch path in which the current $i_2$ flows comprises a series circuit of a resistor 12 and a capacitor 13. On the other hand, as shown in FIG. 1, the current $i_3$ flows in a series circuit of a reactor 15 and a resistor 16. In result, the current of ($i_1 - i_3$) flows to a capacitor $11a$ and the current of ($i_2 + i_3$) flows to a capacitor 14.

The circuit conditions are designed and constructed in a manner such that electrostatic capacities of the capacitors 11 and 14 are fairly larger than the electrostatic capacity of the capacitor 13 ($C_{11}, C_{14} >> C_{13}$) by the method which has been predetermined by the foregoing literature, "IEEE Transactions on Power Delivery, Vol. 3, No. 1, January, 1988". Due to this, when the voltage source current $i_v$ is broken by the testing circuit breaker 1, the current $i_2$ and a voltage $TRV_1$ as an initial portion of a target TRV as shown in FIG. 2 are generated as a voltage drop of a serial circuit of the resistor 12, capacitor 13, and capacitor 14.

By properly selecting the circuit conditions, a next current zero point $i_{20}$ of the current $i_2$ can be generated at a time point which is earlier than a next current zero point $i_{10}$ of the current $i_1$. Although the auxiliary switch 9 can be constructed by various forms, the above related art corresponds to a method which can be easily handled and in which an arc between contacts is ignited by supplying the current source current $i_c$ to the auxiliary switch 9, thereby allowing the voltage source current $i_v$ to be easily supplied, and a breaking performance of the current $i_2$ is given, and there is no need to increase the control gap.

When the current $i_2$ is broken at the next current zero point $i_{20}$ by the above method, if the circuit comprising the reactor 15 and the resistor 16 does not exist in FIG. 1, as shown by an alternate long and short dash line in FIG. 2, a terminal voltage of the testing circuit breaker 1 continuously keeps a predetermined value near an initial peak value $u_f$ of the TRV. In this case, almost of the voltage exists across the capacitor 13 and a terminal voltage of the capacitor 14 is sufficiently low. Therefore, as shown in the diagram, by previously selecting a proper number of stages from among multi-stage serial capacitors 11 and by connecting as the capacitor 11a to the capacitor 14 through the reactor 15 and the resistor 16, the voltage of the capacitor 14 can be raised with a delay time by the current $i_3$ (such a change assumes $TRV_2$) and a voltage suitable for a 4-parameter indication shown by $(TRV_1 + TRV_2)$ can be applied to the testing circuit breaker 1.

When such a 4-parameter TRV generating circuit is put into practical use, the auxiliary switch 9 causes the largest problem. The further improvement is demanded from a viewpoint of the evaluation of the breaking performance and from a technical or economical viewpoint.

The above conventional technique intends to accomplish the object by allowing all of the short-circuit current $i_c$ from the power source 2 to supply a current to the auxiliary circuit breaker 4, the testing circuit breaker 1 and the auxiliary switch 9. In the case of the auxiliary switch 9, since a breaking portion is damaged by a large current arc, it is necessary to execute the inspection and maintenance frequently and the improvement is required to manage the equipment. On the other hand, there is also a fear such that the breaking operation of the testing circuit breaker 1 is assisted by the generation of the arc voltage of the auxiliary switch 9 and the evaluation of the performance is made advantageously.

SUMMARY OF THE INVENTION

It is a main object of the invention that a 4-parameter TRV having a long peak time which can be applied to a circuit breaker of a high rated voltage is generated and tests of a high reliability can be certainly performed, and in particular, the numbers of inspections and maintenances of first and second auxiliary switches 9 and 20 are remarkably reduced. That is, the auxiliary switches 9 and 20 allow and break the supply of only a small current and the damage of the breaking portion by the current breaking operation is small. Therefore, certain tests can be continuously executed a number of times without exchanging the breaking parts.

Another object of the invention is that the number of testing circuit breaker, auxiliary circuit breaker, and auxiliary switch through which a current source current flows is minimized and an arc voltage upon breaking of the current by those apparatus is reduced, thereby reducing a decrease in current source current $i_c$ and a distortion near the current zero point and thereby more accurately verifying the current breaking performance of the testing circuit breaker.

Still another object of the invention is to construct the auxiliary switch by a switch of a smaller capacity, thereby obtaining an economical test circuit.

To accomplish the above objects, the inherent current source current $i_c$ is supplied to only the auxiliary circuit breaker 4 and the testing circuit breaker 1 and a small current which is fairly smaller than the current source current $i_c$ and which is set to a value of at least about 1/10 to 1/100 of the $i_c$ is supplied to the auxiliary switch 9 from the side of the current source 2 or from a power source which is separately provided through a high impedance and an auxiliary switch. As an impedance, any one of a reactor and a capacitor can accomplish the above object. On the other hand, as a power source to supply a small current, a resonance circuit comprising a capacitor and a reactor can be also used as a third power source different from the power source 2.

In a state in which a small current from the power source 2 or the resonance circuit flows, the auxiliary switch 9 in the voltage source circuit is opened almost simultaneously with the auxiliary circuit breaker 4 and the testing circuit breaker 1 and the like. The auxiliary switch 9 operates so as to break the current at the time point of the final zero point of the current source current $i_c$. Therefore, the connection of the voltage source circuit just before the final zero point of the current source current $i_c$, that is, the current supply of the voltage source current $i_v$ and the interruption of the capacitor circuit current $i_2$ by the auxiliary switch 9 to generate a 4-parameter TRV after that can be also easily accomplished. As mentioned above, since a large current is not supplied to the auxiliary switch 9, electrodes and the like are hardly consumed. Thus, the extremely stable operation can be continued for a long time without any inspection.

BRIEF DESCRIPTION OF THE DRAWINGS

Preferred embodiments of the present invention will now be described in conjunction with the accompanying drawings, in which.

DESCRIPTION OF THE PREFERRED EMBODIMENTS

Embodiments of the present invention will be described in detail hereinbelow with reference to the drawings.

Figure 3:
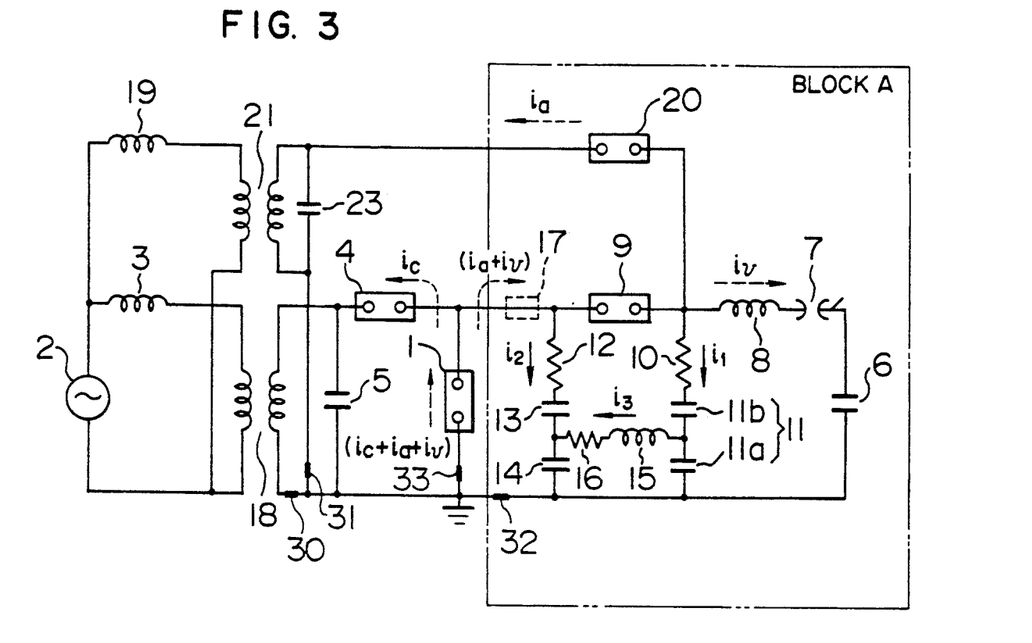
FIG. 3 is a circuit diagram of the first embodiment of a synthetic equivalent test circuit of a circuit breaker according to the present invention.
Figure 4:
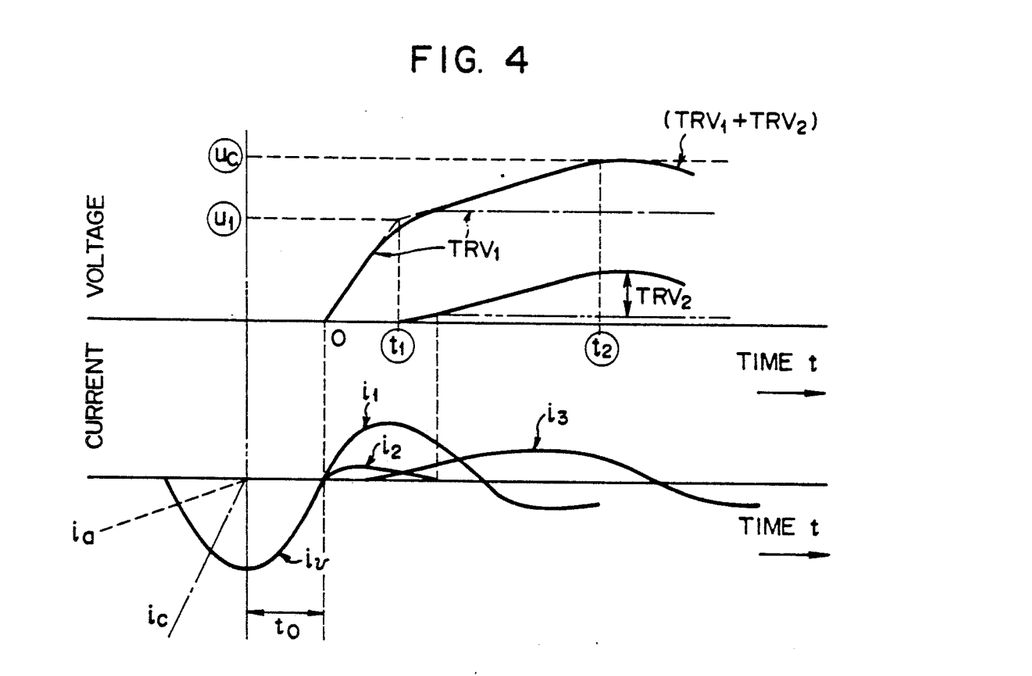
FIG. 4 is a diagram for explaining a phenomenon of the test circuit shown in FIG. 3.

FIG. 3 is a circuit diagram of the first embodiment of a synthetic equivalent test circuit of a circuit breaker according to the invention. FIG. 4 is an explanatory diagram of a phenomenon of the test circuit shown in FIG. 3.

The circuit diagram of the first embodiment of the invention shown in FIG. 3 differs from the conventional circuit diagram shown in FIG. 1 with respect to the following points. That is, the current source current $i_c$ is not supplied to the auxiliary switch 9 but is supplied to only a serial circuit comprising the auxiliary circuit breaker 4 and the testing circuit breaker 1. For instance, a reactor 19, a transformer 21, and a second auxiliary switch 20 are newly provided on the side of the current source 2. A circuit in which a small current $i_a$ flows so as to be fed back along a path of the reactor 19→the transformer 21→the second auxiliary switch 20→the first auxiliary switch 9→testing circuit breaker 1→the ground side of the transformer 21 is separately added to the first auxiliary switch 9 in the voltage source circuit. In this case, a protection surge absorber 23 is arranged in parallel on the side of the transformer 21 because of the same reason as that of the current source protection surge absorber 5 in many cases.

In a manner similar to the auxiliary circuit breaker 4, the second auxiliary switch 20 is provided to protect the small current source, that is, the second current source circuit from a high voltage after the current flowed.

By the above modification, the testing circuit breaker 1, the auxiliary circuit breaker 4, and the first and second auxiliary switches 9 and 20 are closed, thereby supplying the large current $i_c$ of the current source to the testing circuit breaker 1 and the auxiliary circuit breaker 4 and supplying the small current $i_a$ to the testing circuit breaker 1 and the first and second auxiliary switches 9 and 20. After that, for instance, both of the testing circuit breaker 1 and the auxiliary circuit breaker 4 and both of the first and second auxiliary switches 9 and 20 are almost simultaneously opened. The control gap 7 is discharged just before the final zero point of the current source current $i_c$, thereby allowing the voltage source current $i_v$ to flow in the direction shown in FIG. 3 from the precharged capacitor 6 along a path comprising the control gap 7→the reactor 8→the first auxiliary switch 9→the testing circuit breaker 1. FIG. 4 shows the relations among the small current $i_a$, the current source current $i_c$, and the voltage source current $i_v$. The currents $i_c$, $i_a$, $i_v$, and $(i_c + i_a + i_v)$ in the respective sections are measured by shunts 30, 31, 32, and 33 shown in FIG. 3, respectively.

Although the breaking performance of the first auxiliary switch 9 is sufficiently smaller than that of the testing circuit breaker 1, it is selected in a manner such that after the testing circuit breaker 1 succeeded in breaking of the voltage source current $i_v$, the current $i_2$ can be broken at the next current zero point. When the testing circuit breaker 1 succeeds in the current breaking, as shown in FIG. 4, a TRV suitable to indicate four parameters can be applied between the terminals of the testing circuit breaker 1 because of the reasons which are almost similar to the reasons which have been described in FIGS. 1 and 2.

That is, in FIG. 4, there are specified four parameters ($t_1$, $u_1$, $t_2$, $u_c$) comprising certain reference times $t_1$ and $t_2$ of a voltage waveform which is applied between the poles of the testing circuit breaker after the current was broken and respective voltage values $u_1$ and $u_c$ at those times. If those four parameters ($t_1$, $u_1$, $t_2$, $u_c$) which were actually measured satisfy specified values, it is determined that the testing circuit breaker has a desired breaking performance.

Further, it is sufficient to supply the large current $i_c$ of the current source to only the testing circuit breaker 1 and the auxiliary circuit breaker 4 and to supply the small current $i_a$ to the first and second auxiliary switches 9 and 20. Therefore, the current breaking portions of the auxiliary switches 9 and 20 are hardly damaged. Thus, only an area of a block A in FIG. 3 is constructed as a set and only such a set can be used for a long time.

In FIG. 3, an artificial line 17, (which consists of multi-stage series reactors and condensers connected between each reactors' terminals and the connecting point of the first auxiliary switch 9 and the resistor 12), (cf. for example, IEEE Transactions on Power Apparatus and Systems, p. 774, May/June, 1972, Vol. PAS-91, no. 3, "Synthetic Testing and Interrupting Phenomena Under Short Line Fault Conditions", S. Yamazaki, M. Hosokawa, T. Gotoh, K. Nakanishi and J. Tomiyama), to test a fault of a short line can be inserted into a region shown by a broken line in the diagram, for instance, as a part of a line route starting from a node of the first auxiliary switch 9 and the resistor 12 and reaching a node of the testing circuit breaker 1 and the auxiliary circuit breaker 4. Since the circuit can be constructed as mentioned above, by providing a circuit breaker (not shown) in parallel with the artificial line 17, the switching between the ordinary short-circuit fault test and the short line fault test circuit as mentioned above can be performed in a manner similar to the case of the conventional Weil synthetic test.

Figure 5:
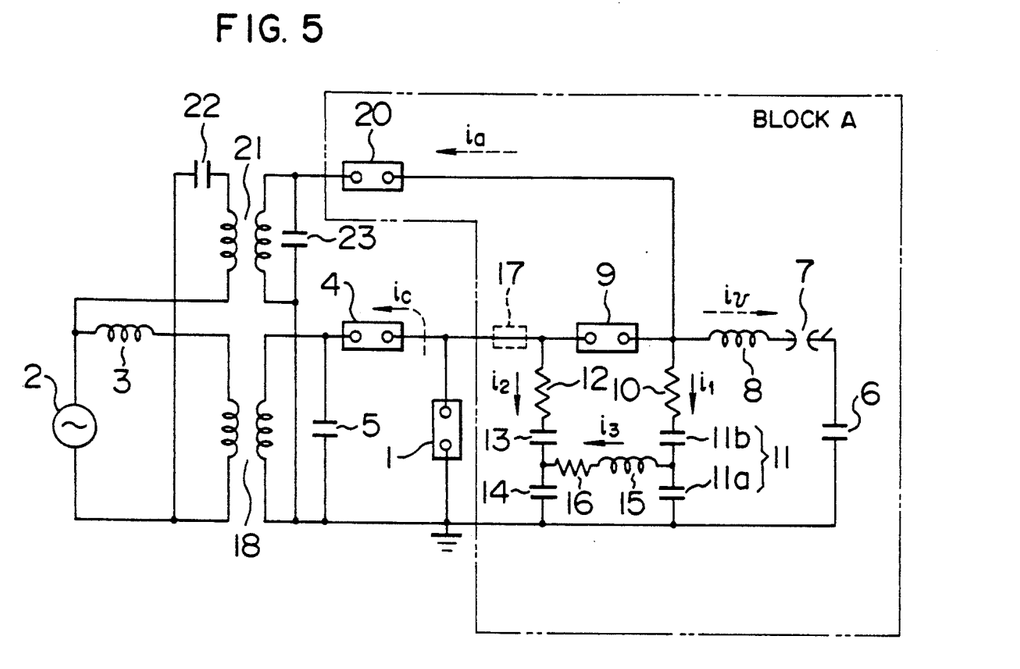
FIG. 5 is a circuit diagram of the second embodiment of a synthetic equivalent test circuit of a circuit breaker according to the invention.

FIG. 5 is a circuit diagram of the second embodiment of the invention. In the embodiment, a current limiting capacitor 22 is arranged on the primary side of the transformer 21, thereby allowing the small current $i_a$ to flow through the first and second auxiliary switches 9 and 20.

Figure 6:
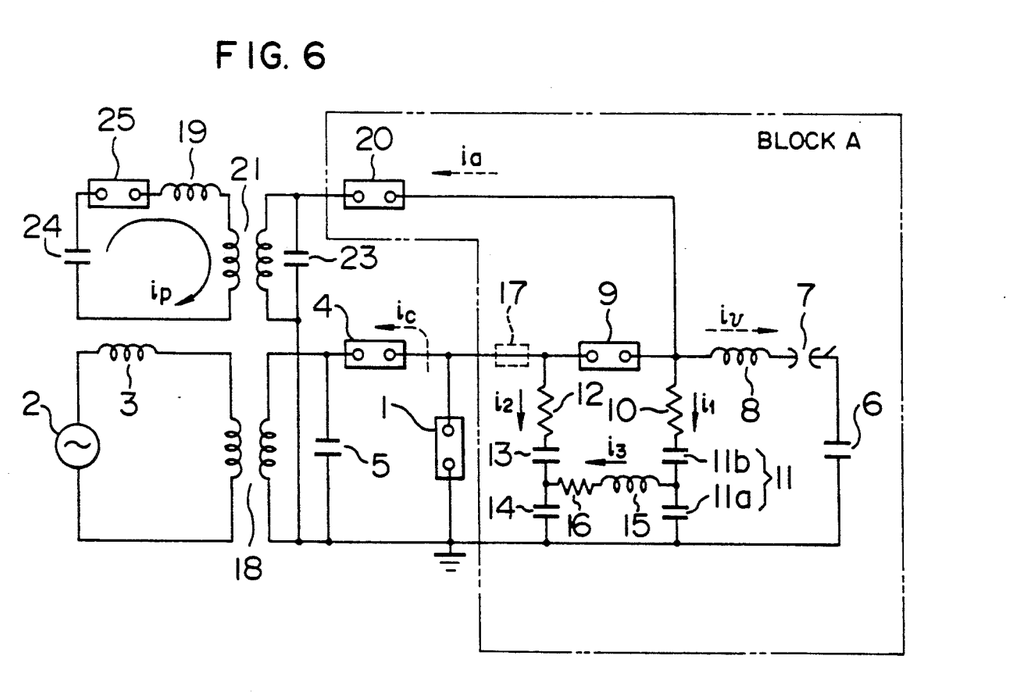
FIG. 6 is a circuit diagram of the third embodiment of a synthetic equivalent test circuit of a circuit breaker according to the invention.

• FIG. 6 is a circuit diagram of the third embodiment of the invention. The small current $i_a$ is similarly allowed to flow through the first and second auxiliary switches 9 and 20. The third embodiment uses a method in which the charges which have previously been charged in a capacitor 24 arranged on the primary side of the transformer 21 are discharged by closing a closing switch 25, thereby allowing a resonance current $i_p$ whose frequency and phase are almost similar to those of, for instance, the current source current $i_c$ to flow.

Figure 7:
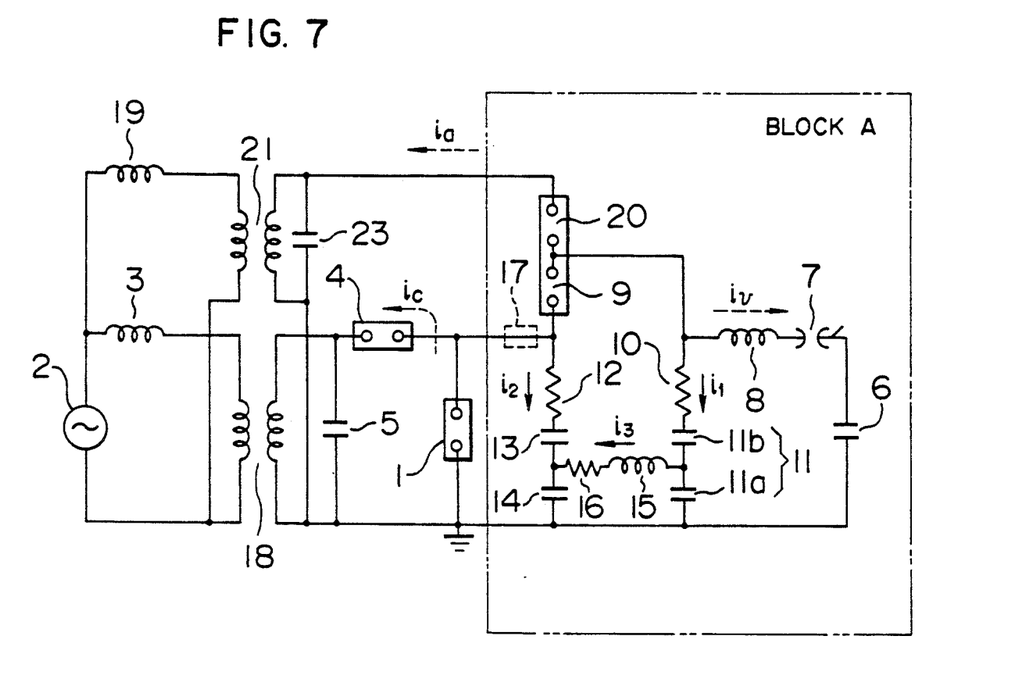
FIG. 7 is a circuit diagram of the fourth embodiment of a synthetic equivalent test circuit of a circuit breaker according to the invention.

FIG. 7 is a circuit diagram of the fourth embodiment of the invention. In a manner similar to the above, the small current $i_a$ is allowed to flow through the first and second auxiliary switches 9 and 20 and the breaking sections of the double-break circuit breakers are used for the first and second auxiliary switches 9 and 20.

Figure 8:
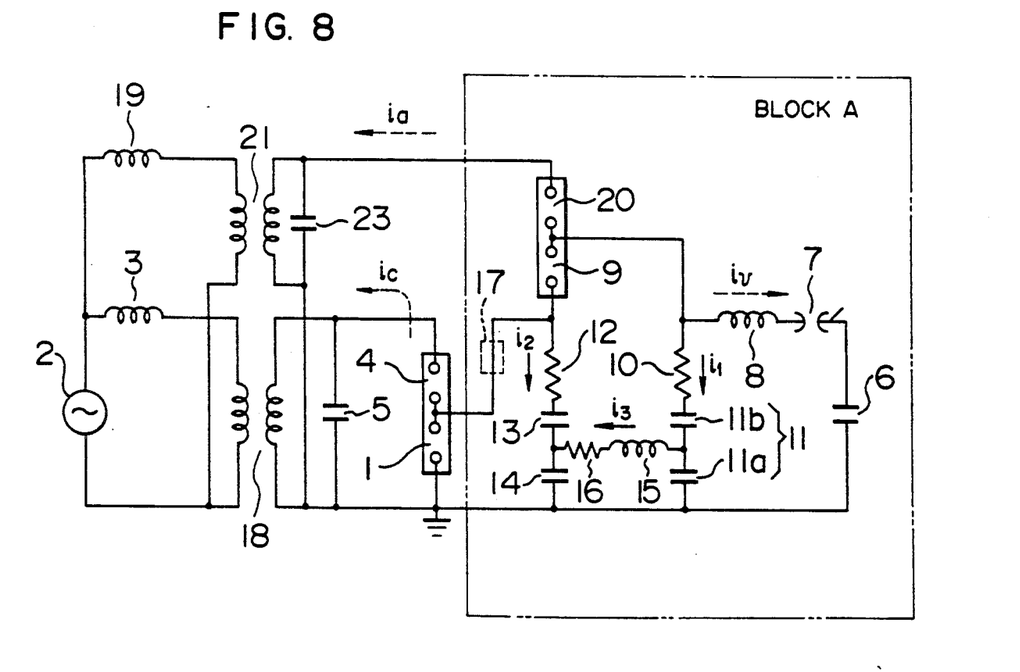
FIG. 8 is a circuit diagram of the fifth embodiment of a synthetic equivalent test circuit of a circuit breaker according to the invention.

FIG. 8 is a circuit diagram of the fifth embodiment of the invention.

In all of the first to fourth embodiments, the single-break circuit breaker 1 to be tested has been shown. However, in the unit tests of the double-break circuit breaker, for instance, as shown in FIG. 8, it is possible to use a form in which one unit in a one-pole of two-units construction is used as the auxiliary circuit breaker 4 and the remaining one unit is used as the testing circuit breaker 1. The fifth embodiment can be applied to a multi-breaks circuit breaker of two or more interrupters.

In the case of the example of the conventional related art, there is a drawback such that the test circuit is improper to the unit test of the circuit breaker having two or more interrupters. However, the fifth embodiment can also eliminate such a drawback.

In all of the above-described embodiments, the low voltage side terminal of the winding on the right side in the diagram of the transformer 21 has been connected to the ground and the small current $i_a$ flows through the first and second auxiliary switches 9 and 20. However, the small current $i_a$ also certainly flows through the testing circuit breaker 1.

Figure 9:
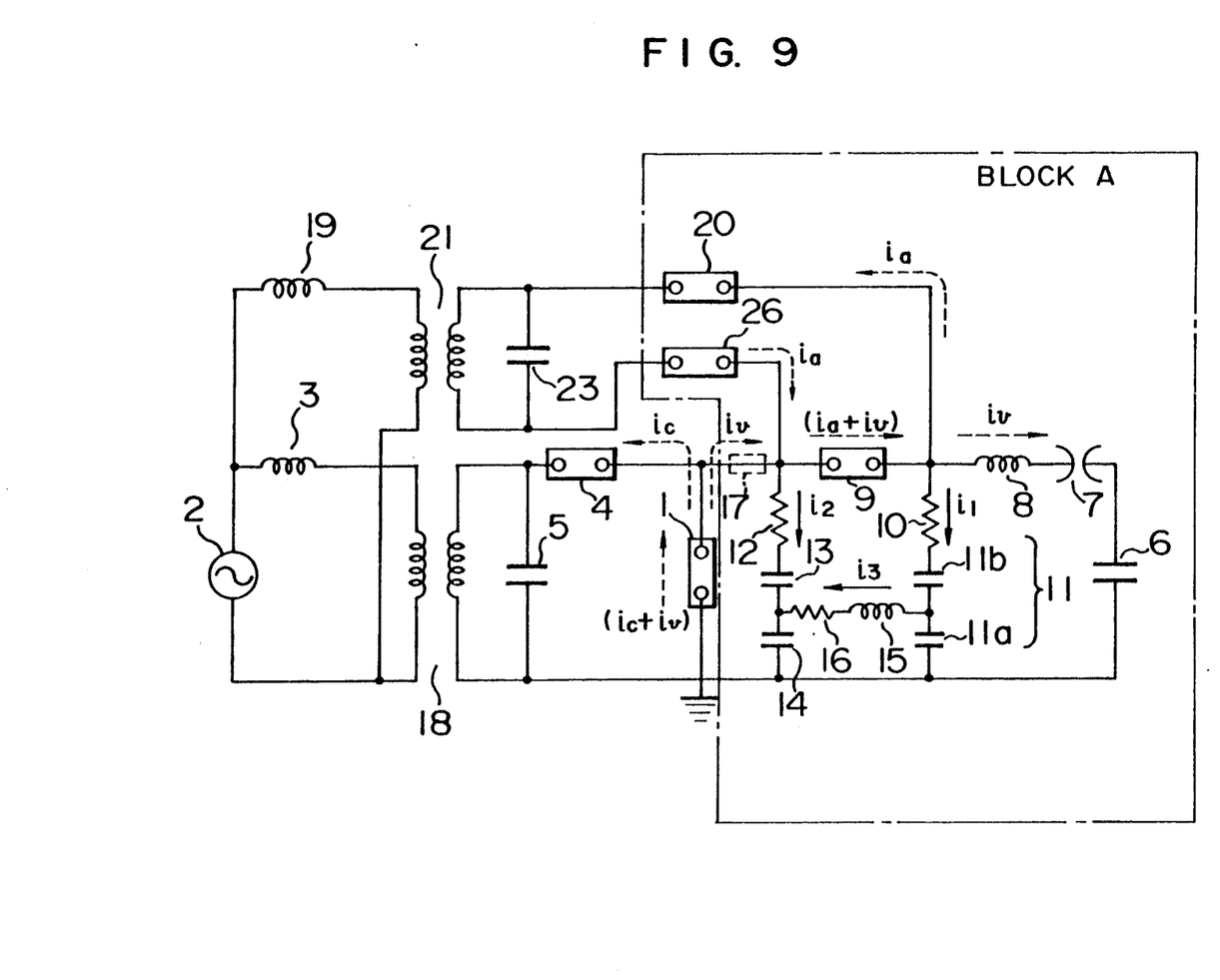
FIG. 9 is a circuit diagram of the sixth embodiment of a synthetic equivalent test circuit of a circuit breaker according to the invention.

The sixth embodiment as shown in FIG. 9 will now be described as a circuit to block that the current $i_a$ flows through the testing circuit breaker 1.

Both of the secondary side terminals of the transformer 21 are floated from the ground. In a manner similar to FIGS. 3 to 8 of the above embodiments, one of the secondary side terminals is connected to the second auxiliary switch 20. A third auxiliary switch 26 is newly connected to the other one of the secondary side terminals. After passing through the second and third auxiliary switches 20 and 26, both of the secondary side terminals of the transformer 21 are connected to both terminals of the first auxiliary switch 9.

According to such a circuit, the 4-parameter TRV circuit can be tested in a form such as to supply only the current source current $i_c$ and the voltage source current $i_v$ to the testing circuit breaker 1 in a manner similar to the case of the Weil circuit.

According to the invention, the following excellent effects are obtained.

(1) Since a circuit construction is such that only a small current is supplied to the switch in the voltage source circuit, the current source current $i_c$ is not influenced by the switch. It is possible to provide a 4-parameter TRV generating circuit which can perform the evaluation with a high reliability.

(2) Since the circuit breaking is executed by supplying the small current $i_a$, the breaking portions of the first, second, and third auxiliary switches 9, 20, and 26 are hardly damaged. The certain tests can be continuously performed a number of times.

(3) Since the large current $i_c$ of the current source is allowed to flow through only the testing circuit breaker 1 and the auxiliary circuit breaker 4 and the small current $i_a$ is allowed to flow through the first, second, and third auxiliary switches 9, 20, and 26, only the region of the block including the auxiliary switches 9, 20, and 26 is constructed as a set and such a set can be used for a long time.

(4) Each of the first, second, and third auxiliary switches 9, 20, and 26 can be constructed by a switch of a small capacity.

(5) The circuit can be simplified by using the double-break circuit breakers for the small current for the first and second auxiliary switches 9 and 20.

(6) The circuit can be simplified by respectively using the multi-break circuit breakers as the testing circuit breaker 1 and the auxiliary circuit breaker 4.

(7) Thus, there is a large economical effect with respect to the maintenance and inspection of the apparatuses. The 4-parameter TRV generating circuit of the highest practical use can be constructed.

And the like.

We claim:

1. A synthetic equivalent test of a circuit breaker, comprising:
   a first current source circuit comprising an A.C. power source, a first transformer connected to said A.C. power source through a first reactor; and a closed circuit comprising a first series circuit of a testing circuit breaker and a first auxiliary circuit breaker connected to a secondary winding of said first transformer, one terminal of said testing circuit breaker being grounded;
   a voltage source circuit comprising:
   a second series circuit of a previously charged voltage source capacitor, a discharge control gap, a second reactor and a first auxiliary switch, both ends of said second series circuit being connected to both ends of said testing circuit breaker;
   a first resistor, and first multi-stage serial capacitors connected between the connecting point of said second reactor and said first auxiliary switch and the ground side of said testing circuit breaker;
   a second resistor and second multi-stage serial capacitors connected between the connecting point of said first auxiliary switch and said testing circuit breaker and the ground side of said testing circuit breaker, the connecting point of said first multi-stage serial capacitors and the connecting point of said second multi-stage serial capacitors being connected by a series circuit of a third reactor and a third resistor; and
   a second current source circuit comprising a second transformer whose primary winding is connected to said A.C. power source through a fourth reactor in parallel to a series circuit of a primary winding of said first transformer and said first reactor connected to said primary winding, one terminal of a secondary winding of said second transformer being connected to a second auxiliary switch, and another end of said second auxiliary switch being connected to the connecting point between said second reactor and said first auxiliary switch in said voltage source circuit, and another terminal of the secondary winding of said second transformer being connected to the ground side of a high voltage winding of said first transformer.

2. A synthetic equivalent test circuit of a circuit breaker according to claim 1 wherein a circuit of the primary winding of said second transformer forming said second current source circuit comprises a resonance circuit including a series closed circuit of a capacitor, said fourth reactor and a closing switch.

3. A synthetic equivalent test circuit of a circuit breaker according to claim 1, wherein the first auxiliary switch in said voltage source circuit and the second auxiliary switch in said second current source circuit are formed by each breaking part of one double-break circuit breaker.

4. A synthetic equivalent test circuit of a circuit breaker according to claim 1, wherein said first auxiliary switch, said second auxiliary switch, said testing circuit breaker and said first auxiliary circuit breaker are formed by each breaking part of one multi-break circuit breaker respectively.

5. A synthetic equivalent test of a circuit breaker, comprising:
   a first current source circuit comprising an A.C. power source, a first transformer connected to said A.C. power source through a first reactor, and a closed circuit comprising a first series circuit of a testing circuit breaker and a first auxiliary circuit breaker connected to a secondary winding of said first transformer, one terminal of said testing circuit breaker being grounded;

a voltage source circuit comprising:

a second series circuit of a previously charged voltage source capacitor, a discharge control gap, a second reactor and a first auxiliary switch, being connected to both ends of said testing circuit breaker;

a first resistor, and first multi-stage serial capacitors connected between the connecting point of said second reactor and said first auxiliary switch and the ground side of said testing circuit breaker;

a second resistor and second multi-stage serial capacitors connected between the connecting point of said first auxiliary switch and said testing circuit breaker and the ground side of said testing circuit breaker, the connecting point of said first multi-stage serial capacitors and the connecting point of said second multi-stage serial capacitors being connected buy a series circuit of a third reactor and a third resistor; and a second current source circuit comprising a second transformer whose primary winding is connected to said A.C. power source through a fourth reactor in parallel to a series circuit of a primary winding of said first transformer and said first reactor connected to said primary winding, one terminal of a secondary winding of said second transformer being connected to a second auxiliary switch, and another end of said second auxiliary switch being connected to the connecting point between said second reactor and said first auxiliary switch in said voltage source circuit, a third auxiliary switch being connected to another terminal of the secondary winding of said second transformer, and another terminal of said third auxiliary switch being connected to the connecting point between said testing circuit breaker and said first auxiliary switch.

* * * * *